US010884172B2

(12) United States Patent
Nagamoto et al.

(10) Patent No.: US 10,884,172 B2
(45) Date of Patent: Jan. 5, 2021

(54) LIGHT EMITTING DEVICE

(71) Applicant: NICHIA CORPORATION, Anan (JP)

(72) Inventors: Takuya Nagamoto, Tokushima (JP); Koichi Amari, Anan (JP); Yuji Sakakihara, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/566,206

(22) Filed: Sep. 10, 2019

(65) Prior Publication Data

US 2020/0096691 A1    Mar. 26, 2020

(30) Foreign Application Priority Data

Sep. 21, 2018  (JP) .................................. 2018-176872
Sep. 25, 2018  (JP) .................................. 2018-178368

(51) Int. Cl.
  *F21V 8/00*   (2006.01)
  *H01L 33/50*  (2010.01)
  *H01L 33/32*  (2010.01)
  *H01L 25/075* (2006.01)

(52) U.S. Cl.
  CPC .......... *G02B 6/0008* (2013.01); *H01L 33/505* (2013.01); *H01L 25/0753* (2013.01); *H01L 33/32* (2013.01)

(58) Field of Classification Search
  CPC ..... G02B 6/0008; H01L 33/505; H01L 33/32; H01L 25/0753; H01L 33/58; H01L 33/50
  See application file for complete search history.

(56) References Cited

U.S. PATENT DOCUMENTS

| | | | | |
|---|---|---|---|---|
| 2004/0105250 A1* | 6/2004 | Leu | ...................... | G02B 6/0036 362/609 |
| 2004/0149998 A1* | 8/2004 | Henson | .................... | F21S 41/24 257/98 |
| 2007/0279352 A1 | 12/2007 | Tanaka | | |
| 2010/0026703 A1* | 2/2010 | Parker | .................... | G02B 6/005 345/589 |
| 2012/0224366 A1* | 9/2012 | Tsai | .................... | H01L 25/0753 362/235 |

(Continued)

FOREIGN PATENT DOCUMENTS

| | | |
|---|---|---|
| JP | 8-313811 A | 11/1996 |
| JP | 2006-286701 A | 10/2006 |
| JP | 2007-328309 A | 12/2007 |

(Continued)

*Primary Examiner* — Mary Ellen Bowman
(74) *Attorney, Agent, or Firm* — Birch, Stewart, Kolasch & Birch, LLP

(57) ABSTRACT

A light-emitting device includes a light-emitting element having a light-emitting surface, and a plurality of protruding portions being separated from each other and disposed on the light-emitting surface. The protruding portions are transparent. Each of the protruding portions includes a light guide portion and a light distribution control portion. The light guide portion has a columnar configuration and is provided at a light-emitting surface side of the protruding portion. The light distribution control portion is provided on the light guide portion. The light distribution control portion is asymmetric with respect to a central axis of the light guide portion and has a tilted surface that is tilted with respect to the central axis.

16 Claims, 11 Drawing Sheets

(56) References Cited

U.S. PATENT DOCUMENTS

2012/0313127 A1\* 12/2012 Chuang ................ H01L 33/504
257/98

FOREIGN PATENT DOCUMENTS

| JP | 2011-124023 A | 6/2011 |
|----|---------------|--------|
| JP | 2011-249455 A | 12/2011 |
| JP | 2011-530090 A | 12/2011 |
| JP | 2017-50329 A | 3/2017 |

\* cited by examiner

LIGHT EMITTING DEVICE

CROSS-REFERENCE TO RELATED APPLICATIONS

This application is based upon and claims priority to Japanese Patent Application No. 2018-176872, filed on Sep. 21, 2018, and Japanese Patent Application No. 2018-178368, filed on Sep. 25, 2018, the entire contents of which are incorporated herein by reference.

BACKGROUND

The disclosure relates to a light-emitting device.

A lighting device that uses a light-emitting device including, for example, an LED (Light Emitting Diode) as a light source controls the light distribution of the light emitted from the light-emitting device by using a lens (a secondary lens), a reflector, a prism sheet, or the like provided separately from the light-emitting device.

SUMMARY

According to an embodiment of the disclosure, a light-emitting device includes a light-emitting element having a light-emitting surface, and a plurality of protruding portions being separated from each other and disposed on the light-emitting surface. The protruding portions are transparent. Each of the protruding portions includes a light guide portion and a light distribution control portion. The light guide portion has a columnar configuration and is provided at a light-emitting surface side of the protruding portion. The light distribution control portion is provided on the light guide portion. The light distribution control portion is asymmetric with respect to a central axis of the light guide portion and has a tilted surface that is tilted with respect to the central axis.

According to another embodiment of the disclosure, a light-emitting device includes a light-emitting element having a light-emitting surface, and a plurality of protruding portions being separated from each other and disposed on the light-emitting surface. The protruding portions are transparent. Each of the protruding portions has a bottom surface and a tilted surface. The bottom surface is a circle or an n-gon (n being an integer of 5 or more). The tilted surface is tilted with respect to the bottom surface. Each of the protruding portions is asymmetric with respect to an axis perpendicular to the bottom surface. The axis passes through a center of the bottom surface.

The disclosure can provide a light-emitting device in which light distribution control is performed by the structure of the light-emitting device itself.

DETAILED DESCRIPTION OF EMBODIMENTS

Figure 1:
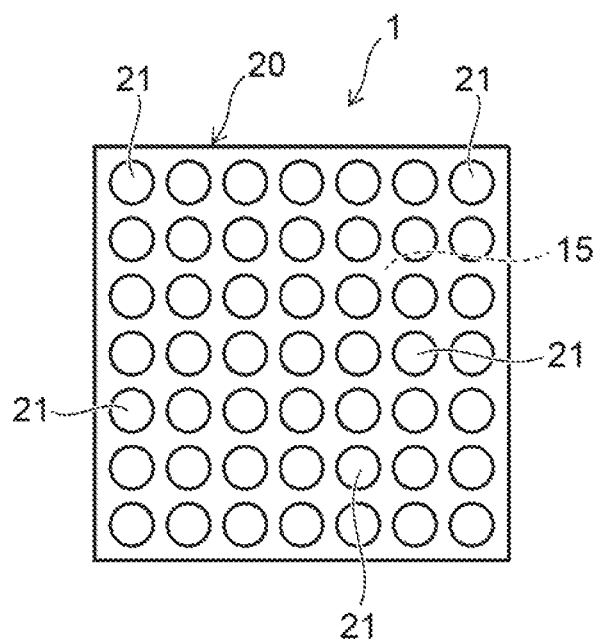
FIG. 1 is a top view of a light-emitting device of a first embodiment of the disclosure.

Embodiments will now be described with reference to the drawings. The same components in the drawings are marked with the same reference numerals.

Figure 2:
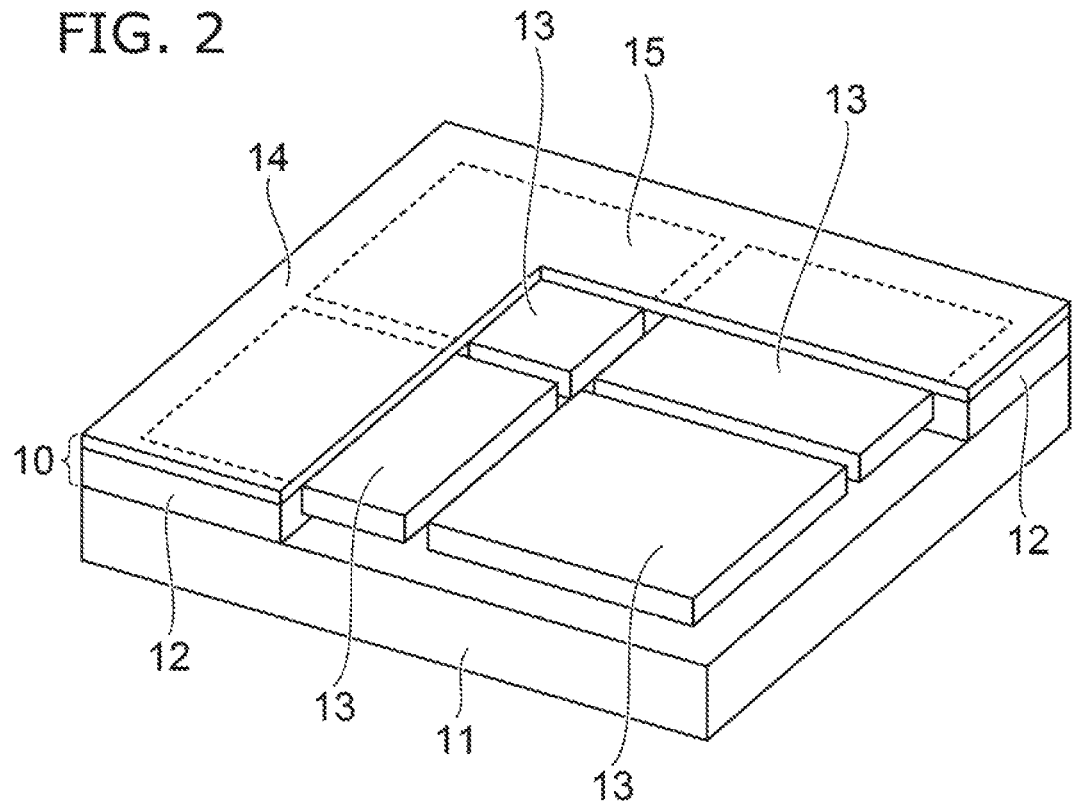
FIG. 2 is a partially cut-away perspective view of a substrate and a light-emitting element of the light-emitting device of the first and second embodiments of the disclosure.

FIG. 1 is a top view of a light-emitting device 1 of a first embodiment of the disclosure. FIG. 2 is a partially cut-away perspective view of a substrate 11 and a light-emitting element 10 of the light-emitting device 1 of the first embodiment of the disclosure.

The light-emitting device 1 includes the substrate 11, the light-emitting element 10, and a light distribution control member 20. As shown in FIG. 2, the light-emitting element 10 is disposed on the substrate 11. The light distribution control member 20 shown in FIG. 1 is disposed on the light-emitting element 10.

The light-emitting element 10 includes a chip 13 disposed on the substrate 11, and a fluorescent layer 14 disposed on the chip 13.

The chip 13 includes an electrode and a semiconductor stacked portion including a light-emitting layer. One or multiple chips 13 are disposed on the substrate 11. In the example shown in FIG. 2, four chips 13 are disposed on the substrate 11. A resin member 12 also is disposed on the substrate 11. The resin member 12 is disposed at the periphery of the chip 13 and covers the side surface of the chip 13.

The fluorescent layer 14 is disposed on the upper surface of the chip 13 and on the upper surface of the resin member 12. The upper surface of the fluorescent layer 14 is used as a light-emitting surface 15 of the light-emitting element 10. Or, the light-emitting element 10 may include a transparent layer not including a fluorescent. Or, the light-emitting element 10 may not include another member on the chip 13; and in such a case, the upper surface of the chip 13 is the upper surface of the light-emitting element 10.

The fluorescent layer 14 includes a main material, and a fluorescent dispersed in the main material. For example, a silicone resin, an epoxy resin, glass, etc., can be used as the material of the main material of the fluorescent layer 14. The fluorescent is excited by the light emitted by the chip 13 and emits light of a wavelength different from the wavelength of the light emitted by the chip 13.

The semiconductor stacked portion of the chip 13 includes, for example, $In_xAl_yGa_{1-x-y}N$ ($0 \le x$, $0 \le y$, and $x+y \le 1$) and can emit bluish light. The fluorescent layer 14 that includes a fluorescent having, for example, a yellowish light emission can be combined with the chip 13 emitting the bluish light. Or, the fluorescent layer 14 that includes a fluorescent having a greenish light emission and a fluorescent having a reddish light emission can be combined with the chip 13 emitting the bluish light.

The resin member 12 is reflective or light-shielding to the light emitted by the light-emitting element 10 (the light emitted by the chip 13 and the light emitted by the fluorescent). The resin member 12 includes, for example, a main material, and a reflective material or a light-shielding material dispersed in the main material. The main material may be the same as the main material of the fluorescent layer 14. For example, titanium oxide, zinc oxide, silicon oxide, zirconium oxide, aluminum oxide, aluminum nitride, etc., are examples of the reflective material.

The light distribution control member 20 shown in FIG. 1 is disposed on the light-emitting surface 15 of the light-emitting element 10 (the upper surface of the fluorescent layer 14). The light distribution control member 20 is disposed in a region within the surface of the light-emitting surface 15.

Figure 3:
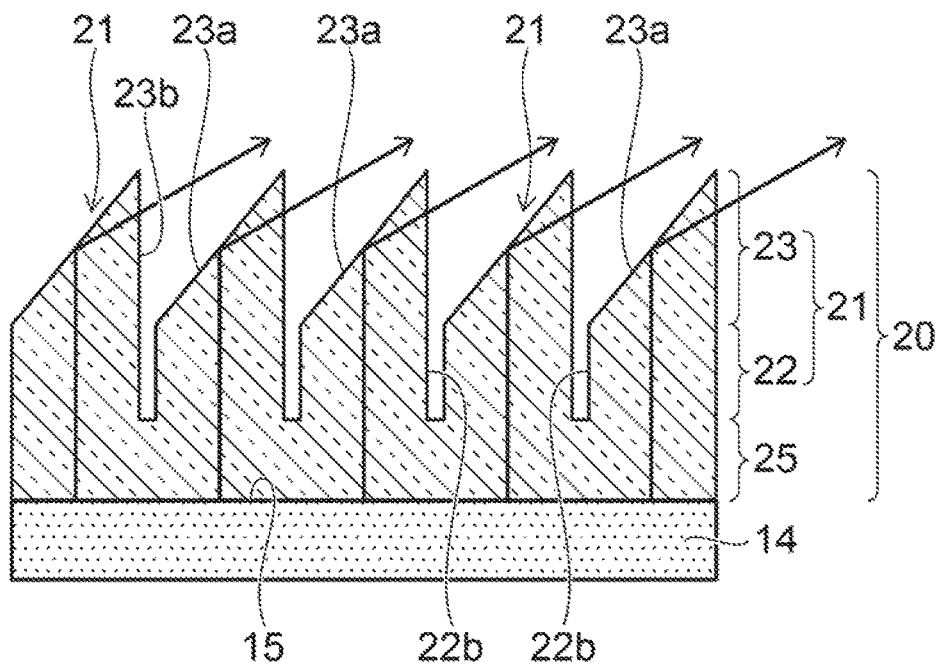
FIG. 3 is a schematic cross-sectional view of a light distribution control member of the light-emitting device of the first embodiment of the disclosure.

FIG. 3 is a schematic cross-sectional view of the light distribution control member 20.

The light distribution control member 20 is transparent to the light emitted by the light-emitting element 10 (the light emitted by the chip 13 and the light emitted by the fluorescent). The light distribution control member 20 may include, for example, a glass material. Or, the light distribution control member 20 may be formed from a resin material.

The light distribution control member 20 includes a base portion 25, and multiple protruding portions 21 provided on the base portion 25. The protruding portion 21 includes a light guide portion 22 and a light distribution control portion 23. The base portion 25, the light guide portion 22, and the light distribution control portion 23 are provided as one body of the same material.

The base portion 25 is disposed between the light-emitting surface 15 and the protruding portions 21 and spreads continuously along the surface of the light-emitting surface 15. The base portion 25 supports the multiple protruding portions 21 as one body. The base portion 25 contacts the light-emitting surface 15 (the upper surface of the fluorescent layer 14). Or, the base portion 25 is disposed on the light-emitting surface 15 by interposing a film or the like that is transparent to the light emitted by the light-emitting element 10.

The light guide portion 22 is provided between the light distribution control portion 23 and the base portion 25 and is more proximal to the light-emitting surface 15 than is the light distribution control portion 23.

The multiple protruding portions 21 are separated from each other; and air is interposed between the mutually-adjacent protruding portions 21. As shown in FIG. 1, the multiple protruding portions 21 have a uniform arrangement over the entire region of the light-emitting surface 15.

The light guide portion 22 may have a columnar configuration having a side surface 22b perpendicular to the light-emitting surface 15. The light distribution control portion 23 is provided as one body with the light guide portion 22 on the light guide portion 22. When viewed in the cross-section shown in FIG. 3, for example, the light distribution control portion 23 may have a triangular cross section. In other words, the light distribution control portion 23 may have a configuration having a tilted surface 23a tilted with respect to the light-emitting surface 15.

Figure 4:
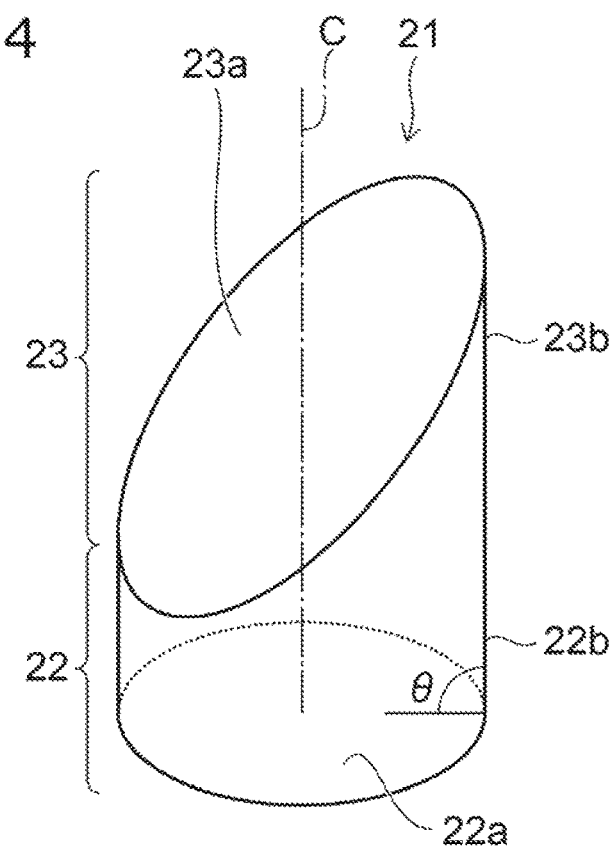
FIG. 4 to FIG. 12 are perspective views of a protruding portion of the light-emitting device of the first embodiment of the disclosure.

FIG. 4 is a perspective view of the protruding portion 21.

As shown in FIG. 4, the light guide portion 22 may have, for example, a circular columnar configuration having a circular bottom surface 22a. An angle θ of the side surface 22b of the light guide portion 22 with respect to the bottom surface 22a of the light guide portion 22 can be set to 90°. From the perspective of easily forming the protruding portion 21, it is favorable for the angle θ of the side surface 22b with respect to the bottom surface 22a of the light guide portion 22 to be 90° or less.

The light distribution control portion 23 may have a configuration in which a portion of a circular column having the same diameter as the diameter of the light guide portion 22 is cut obliquely. The light distribution control portion 23 has the tilted surface 23a that is tilted with respect to a central axis C of the light guide portion 22, and a side surface 23b that is continuous along the same surface as the side surface 22b of the light guide portion 22. The central axis C of the light guide portion 22 is an imaginary axis perpendicular to the bottom surface 22a and passing through the center of the bottom surface 22a of the light guide portion 22.

The light distribution control portion 23 is asymmetric with respect to the central axis C of the light guide portion 22. The central axis C of the light guide portion 22 passes through the tilted surface 23a of the light distribution control portion 23; and no vertex or edge of the light distribution control portion 23 is positioned on the central axis C.

The tilted surface 23a is a flat surface. Or, the tilted surface 23a may be a curved surface. It is easier to form the protruding portion 21 to have the tilted surface 23a that is a flat surface than to have the tilted surface 23a that is a curved surface.

The tilted surface 23a and the side surface 23b of the light distribution control portion 23 contact air; and the side surface 22b of the light guide portion 22 also contacts air.

The light that is emitted from the light-emitting surface 15 of the light-emitting element 10 enters the light distribution control member 20. The light that enters the light distribution control member 20 travels through the base portion 25 and through the light guide portion 22 and is reflected at the interface between the air and the tilted surface 23a of the light distribution control portion 23. The light distribution control portion 23 can include a material, e.g., glass, having a larger refractive index than air and can cause total internal reflection of the light that is incident on the tilted surface 23a at not less than a constant incident angle (critical angle).

The light that is emitted upward from the light-emitting surface 15 is refracted in a designated direction (a direction tilted with respect to the light-emitting surface 15 or a direction parallel to the light-emitting surface 15) by being reflected by the tilted surface 23a. The light that is reflected by the tilted surface 23a is emitted outside the light-emitting device 1 from the side surface 23b of the light distribution control portion 23. Thereby, the light that is emitted from the light-emitting device 1 can be controlled to have a light distribution in which the intensity of the light is relatively high in the designated direction and relatively low in directions other than the designated direction.

According to the first embodiment, the light distribution control is performed by the light-emitting device 1 itself. Therefore, it is possible to downsize and reduce the number of components of the secondary lens, the reflector, the prism, etc., included separately from the light-emitting device 1. According to the application, a secondary lens, a reflector, or a prism may be unnecessary. Accordingly, it is possible to downsize, simplify the configuration, and reduce the number of components of the lighting device in which such a light-emitting device 1 is mounted.

The side surface 22b of the light guide portion 22 also contacts the air; and total internal reflection of the light can occur also at the interface between the air and the side surface 22b of the light guide portion 22. Thereby, the light that is emitted from the light-emitting surface 15 in random directions can be reflected by the side surface 22b of the light guide portion 22 toward the tilted surface 23a. Therefore, the fluctuation of the incident angle of the light incident on the tilted surface 23a of each protruding portion 21 can be small even in the case where the distance between the light-emitting surface 15 and the tilted surface 23a is short for the multiple protruding portions 21. The fluctuation of the light distribution of the light emitted from the light-emitting device 1 can be small thereby.

It is favorable for the material of the protruding portion 21 to be a glass material having a high refractive index to easily cause total internal reflection at the interface between the air and the tilted surface 23a and the interface between the air and the side surface 22b of the light guide portion 22.

As shown in FIG. 3, the tilt angles of the multiple tilted surfaces 23a with respect to the light-emitting surface 15 are aligned at the same angle; and the normals of the multiple tilted surfaces 23a are parallel to each other. The fluctuation of the light distribution of the light emitted from the light-emitting device 1 is reduced thereby.

Or, a configuration may be used in which the multiple tilted surfaces 23a disposed in a first region on the light-emitting surface 15 are tilted at a first angle with respect to the light-emitting surface 15; and the multiple tilted surfaces 23a disposed in a second region on the light-emitting surface 15 are tilted at a second angle with respect to the light-emitting surface 15 that is different from the first angle.

FIG. 5 to FIG. 12 are perspective views showing other examples of the protruding portion. The protruding portions shown in FIG. 5 to FIG. 12 are applicable to the light-emitting device 1 of the first embodiment to replace the protruding portion 21 described above.

Figure 5:
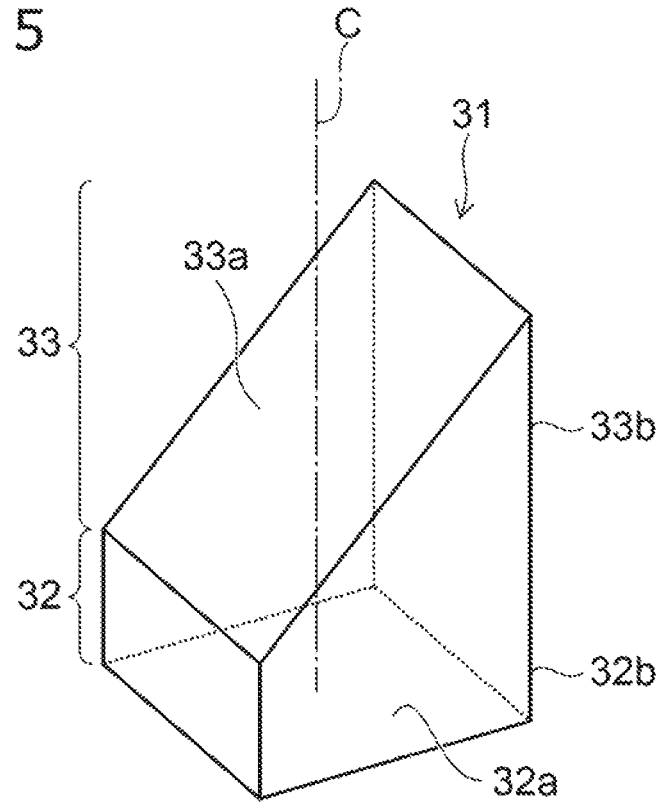

A protruding portion 31 shown in FIG. 5 includes a light guide portion 32, and a light distribution control portion 33 provided on the light guide portion 32 to be one body with the light guide portion 32. The light guide portion 32 is provided to be more proximal to the light-emitting surface 15 than is the light distribution control portion 33.

For example, the light guide portion 32 may have a quadrilateral prism configuration having a quadrilateral bottom surface 32a. The angle of a side surface 32b of the light guide portion 32 with respect to the bottom surface 32a of the light guide portion 32 can be set to, for example, 90°.

The light distribution control portion 33 may have a configuration in which a portion of a quadrilateral prism of the same planar size as the light guide portion 32 is cut obliquely. The light distribution control portion 33 has a tilted surface 33a tilted with respect to the central axis C of the light guide portion 32 and the light-emitting surface 15, and a side surface 33b continuous along the same surface as the side surface 32b of the light guide portion 32. The tilted surface 33a is a flat surface. Or, the tilted surface 33a may be a curved surface.

The light distribution control portion 33 is asymmetric with respect to the central axis C of the light guide portion 32. The central axis C is an imaginary axis perpendicular to the bottom surface 32a and passing through the center of the bottom surface 32a of the light guide portion 32. The central axis C of the light guide portion 32 passes through the tilted surface 33a of the light distribution control portion 33; and no vertex or edge of the light distribution control portion 33 is positioned on the central axis C.

Figure 6:
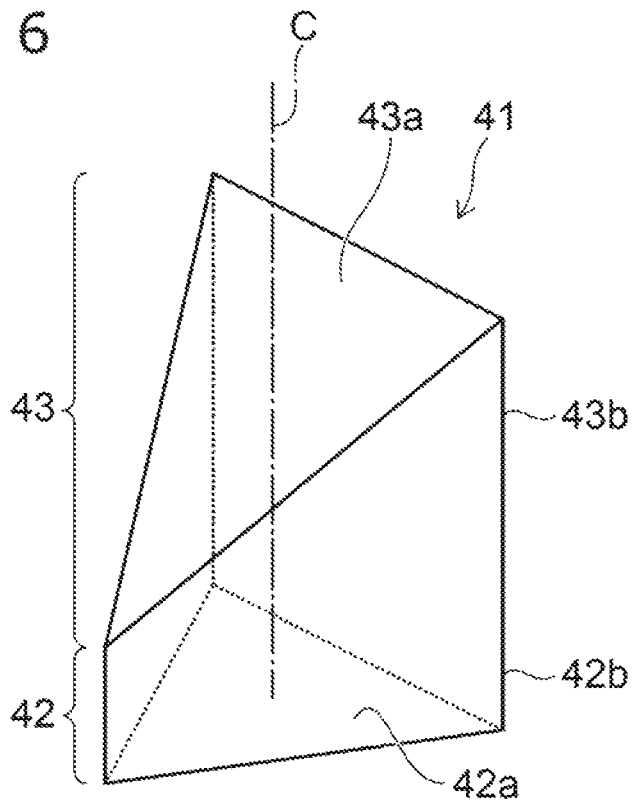

A protruding portion 41 shown in FIG. 6 includes a light guide portion 42, and a light distribution control portion 43 provided on the light guide portion 42 to be one body with the light guide portion 42. The light guide portion 42 is provided to be more proximal to the light-emitting surface 15 than is the light distribution control portion 43.

For example, the light guide portion 42 may have a triangular prism configuration having a triangular bottom surface 42a. The angle of a side surface 42b of the light guide portion 42 with respect to the bottom surface 42a of the light guide portion 42 can be set to 90°.

The light distribution control portion 43 may have a configuration in which a portion of a triangular prism of the same planar size as the light guide portion 42 is cut obliquely. The light distribution control portion 43 has a tilted surface 43a tilted with respect to the central axis C of the light guide portion 42 and the light-emitting surface 15, and a side surface 43b continuous along the same surface as the side surface 42b of the light guide portion 42. The tilted surface 43a is a flat surface. Or, the tilted surface 43a may be a curved surface.

The light distribution control portion 43 is asymmetric with respect to the central axis C of the light guide portion 42. The central axis C is an imaginary axis perpendicular to the bottom surface 42a and passing through the center of the bottom surface 42a of the light guide portion 42. The central axis C of the light guide portion 42 passes through the tilted surface 43a of the light distribution control portion 43; and no vertex or edge of the light distribution control portion 43 is positioned on the central axis C.

Figure 7:
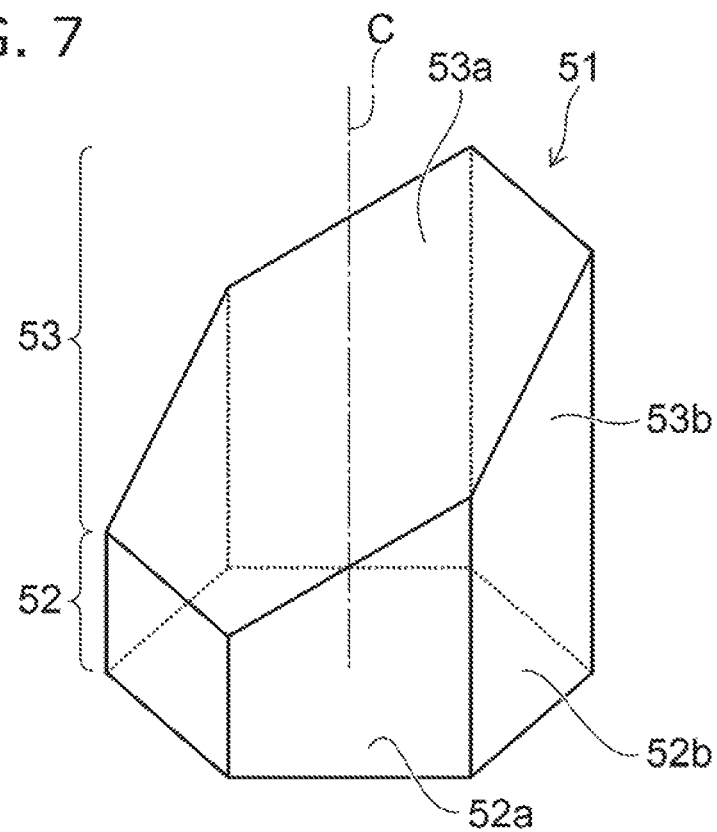

A protruding portion 51 shown in FIG. 7 includes a light guide portion 52, and a light distribution control portion 53 provided on the light guide portion 52 to be one body with the light guide portion 52. The light guide portion 52 is provided to be more proximal to the light-emitting surface 15 than is the light distribution control portion 53.

The light guide portion 52 may have a hexagonal prism configuration having a polygonal (e.g., hexagonal) bottom surface 52a. The angle of a side surface 52b of the light guide portion 52 with respect to the bottom surface 52a of the light guide portion 52 can be set to 90°.

The light distribution control portion 53 may have a configuration in which a portion of a hexagonal prism of the same planar size as the light guide portion 52 is cut obliquely. The light distribution control portion 53 has a tilted surface 53a tilted with respect to the central axis C of the light guide portion 52 and the light-emitting surface 15, and a side surface 53b continuous along the same surface as the side surface 52b of the light guide portion 52. The tilted surface 53a is a flat surface. Or, the tilted surface 53a may be a curved surface.

The light distribution control portion 53 is asymmetric with respect to the central axis C of the light guide portion 52. The central axis C is an imaginary axis perpendicular to the bottom surface 52a and passing through the center of the bottom surface 52a of the light guide portion 52. The central axis C of the light guide portion 52 passes through the tilted surface 53a of the light distribution control portion 53; and no vertex or edge of the light distribution control portion 53 is positioned on the central axis C.

Figure 8:
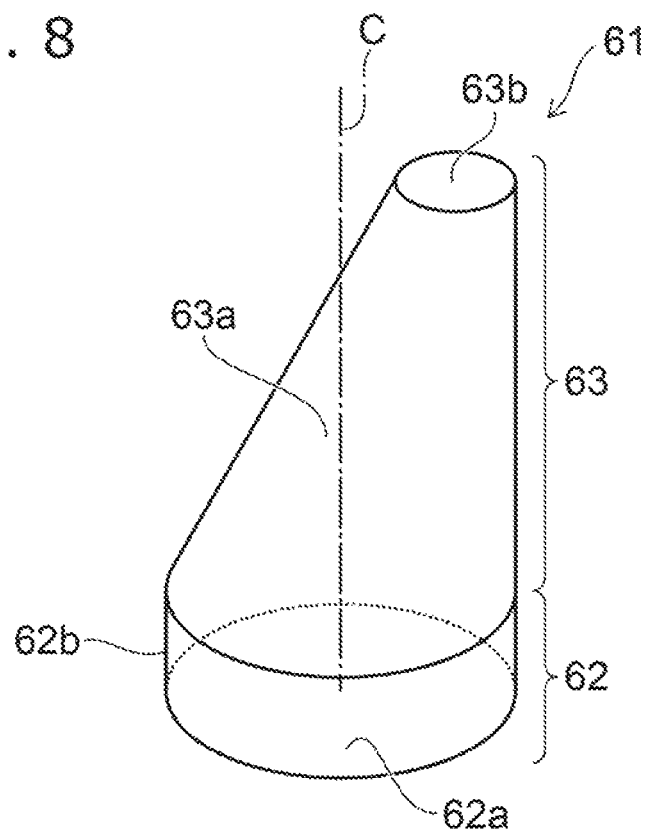

A protruding portion 61 shown in FIG. 8 includes a light guide portion 62, and a light distribution control portion 63 provided on the light guide portion 62 to be one body with the light guide portion 62. The light guide portion 62 is provided to be more proximal to the light-emitting surface 15 than is the light distribution control portion 63.

The light guide portion 62 may be a circular columnar configuration having a circular bottom surface 62a. The angle of a side surface 62b of the light guide portion 62 with respect to the bottom surface 62a of the light guide portion 62 can be set to 90°.

The light distribution control portion 63 may have a truncated circular conical configuration having a bottom surface having the same diameter as the light guide portion 62. The center of an upper surface 63b of the circular configuration of the light distribution control portion 63 is shifted with respect to the center of the bottom surface 62a of the light guide portion 62. The light distribution control portion 63 has a tilted surface 63a tilted with respect to the central axis C of the light guide portion 62 and the light-emitting surface 15. The tilted surface 63a is a curved surface.

The light distribution control portion 63 is asymmetric with respect to the central axis C of the light guide portion 62. The central axis C is an imaginary axis perpendicular to the bottom surface 62a and passing through the center of the bottom surface 62a of the light guide portion 62. The central axis C of the light guide portion 62 passes through the tilted surface 63a of the light distribution control portion 63; and the upper surface 63b of the light distribution control portion 63 is not positioned on the central axis C.

Figure 9:
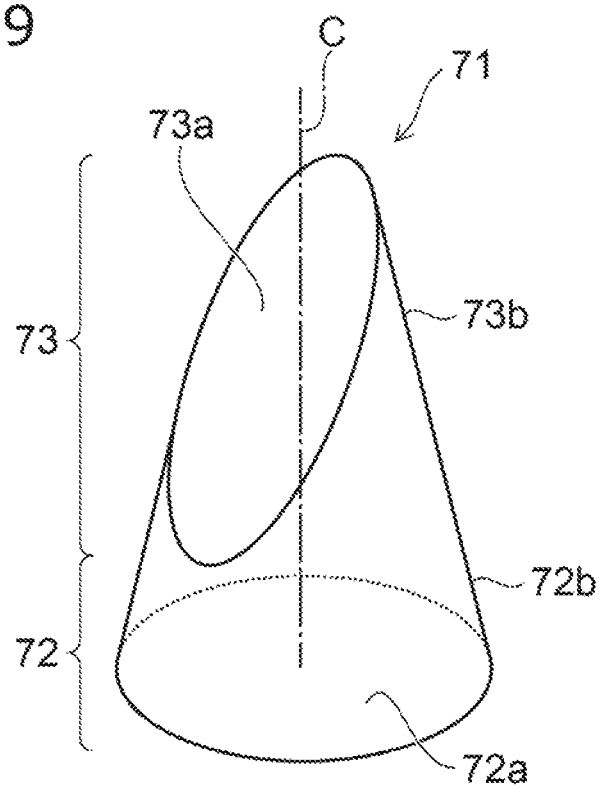

A protruding portion 71 shown in FIG. 9 includes a light guide portion 72, and a light distribution control portion 73 provided on the light guide portion 72 to be one body with the light guide portion 72. The light guide portion 72 is provided to be more proximal to the light-emitting surface 15 than is the light distribution control portion 73.

For example, the light guide portion 72 may have a truncated circular conical configuration having a circular bottom surface 72a. The angle of a side surface 72b of the light guide portion 72 with respect to the bottom surface 72a of the light guide portion 72 is less than 90°.

The light distribution control portion 73 may have a configuration in which a portion of a circular cone continuous with the light guide portion 72 is cut obliquely. The light distribution control portion 73 has a tilted surface 73a tilted with respect to the central axis C of the light guide portion 72 and the light-emitting surface 15, and a side surface 73b continuous along the same surface as the side surface 72b of the light guide portion 72. The tilted surface 73a is a flat surface. Or, the tilted surface 73a may be a curved surface.

The light distribution control portion 73 is asymmetric with respect to the central axis C of the light guide portion 72. The central axis C is an imaginary axis perpendicular to the bottom surface 72a and passing through the center of the bottom surface 72a of the light guide portion 72. The central axis C of the light guide portion 72 passes through the tilted surface 73a of the light distribution control portion 73; and no vertex or edge of the light distribution control portion 73 is positioned on the central axis C.

Figure 10:
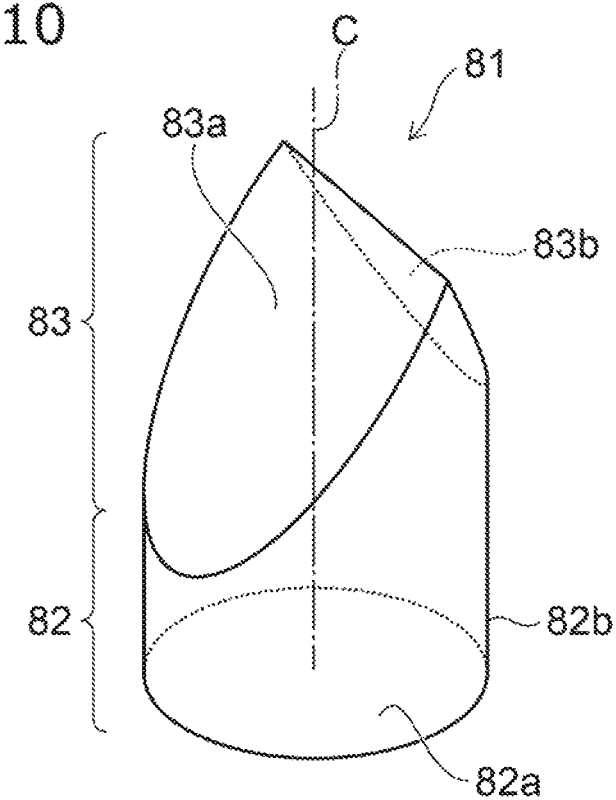

A protruding portion 81 shown in FIG. 10 includes a light guide portion 82, and a light distribution control portion 83 provided on the light guide portion 82 to be one body with the light guide portion 82. The light guide portion 82 is provided to be more proximal to the light-emitting surface 15 than is the light distribution control portion 83.

For example, the light guide portion 82 may have a circular columnar configuration having a circular bottom surface 82a. The angle of a side surface 82b of the light guide portion 82 with respect to the bottom surface 82a of the light guide portion 82 is 90°.

The light distribution control portion 83 may have a configuration in which a circular column having the same diameter as the light guide portion 82 is cut obliquely at multiple locations (e.g., two locations). The light distribution control portion 83 has two tilted surfaces 83a and 83b tilted with respect to the central axis C of the light guide portion 82 and the light-emitting surface 15. The tilted surfaces 83a and 83b are flat surfaces. Or, the tilted surfaces 83a and 83b may be curved surfaces.

The light distribution control portion 83 is asymmetric with respect to the central axis C of the light guide portion 82. The central axis C is an imaginary axis perpendicular to the bottom surface 82a and passing through the center of the bottom surface 82a of the light guide portion 82. The central axis C of the light guide portion 82 passes through the tilted surface 83a of the light distribution control portion 83; and no vertex or edge of the light distribution control portion 83 is positioned on the central axis C.

Figure 11:
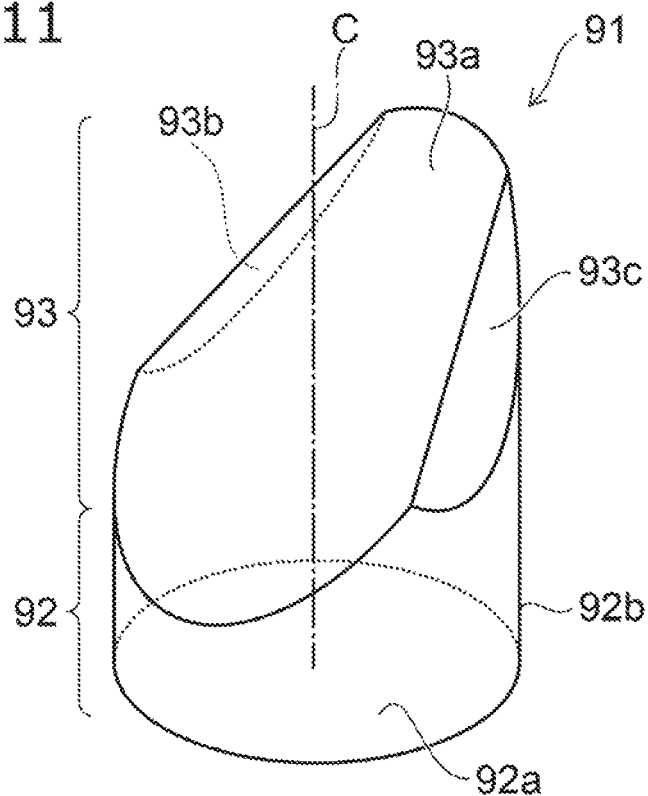

A protruding portion 91 shown in FIG. 11 includes a light guide portion 92, and a light distribution control portion 93 provided on the light guide portion 92 to be one body with the light guide portion 92. The light guide portion 92 is provided to be more proximal to the light-emitting surface 15 than is the light distribution control portion 93.

For example, the light guide portion 92 may have a circular columnar configuration having a circular bottom surface 92a. The angle of a side surface 92b of the light guide portion 92 with respect to the bottom surface 92a of the light guide portion 92 is 90°.

The light distribution control portion 93 has a configuration in which a circular column having the same diameter as the light guide portion 92 is cut obliquely at multiple locations (e.g., three locations). The light distribution control portion 93 has three tilted surfaces 93a, 93b, and 93c tilted with respect to the central axis C of the light guide portion 92 and the light-emitting surface 15. The tilted surfaces 93a, 93b, and 93c are flat surfaces. Or, the tilted surfaces 93a, 93b, and 93c may be curved surfaces.

The light distribution control portion 93 is asymmetric with respect to the central axis C of the light guide portion 92. The central axis C is an imaginary axis perpendicular to the bottom surface 92a and passing through the center of the bottom surface 92a of the light guide portion 92. The central axis C of the light guide portion 92 passes through the tilted surface 93a of the light distribution control portion 93; and no vertex or edge of the light distribution control portion 93 is positioned on the central axis C.

Figure 12:
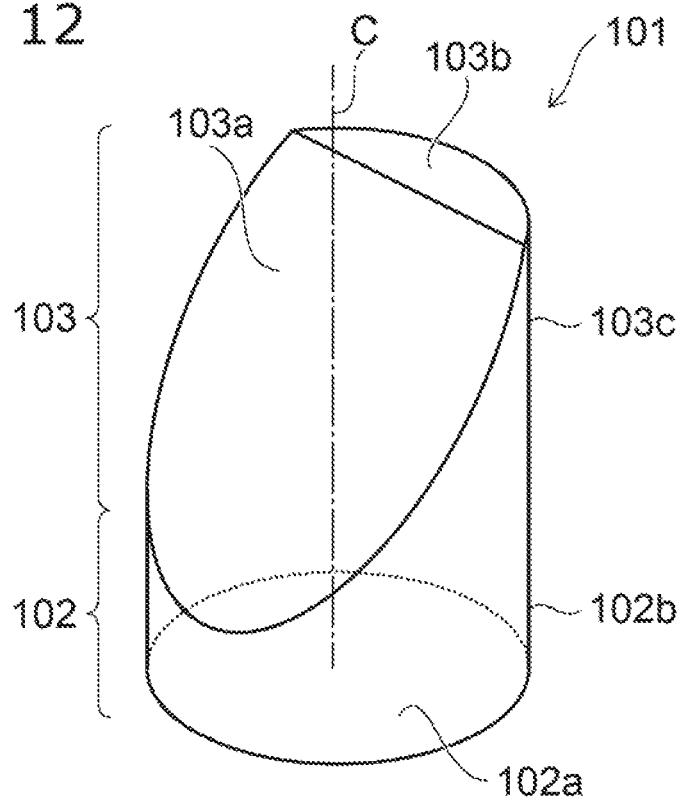

A protruding portion 101 shown in FIG. 12 includes a light guide portion 102, and a light distribution control portion 103 provided on the light guide portion 102 to be one body with the light guide portion 102. The light guide portion 102 is provided to be more proximal to the light-emitting surface 15 than is the light distribution control portion 103.

For example, the light guide portion 102 may have a circular columnar configuration having a circular bottom surface 102a. The angle of a side surface 102b of the light guide portion 102 with respect to the bottom surface 102a of the light guide portion 102 is 90°.

The light distribution control portion 103 may have a configuration in which a portion of a circular column having the same diameter as the light guide portion 102 is cut obliquely. The light distribution control portion 103 has a tilted surface 103a tilted with respect to the central axis C of the light guide portion 102 and the light-emitting surface 15, an upper surface 103b parallel to the light-emitting surface 15, and a side surface 103c continuous along the same surface as the side surface 102b of the light guide portion 102. The tilted surface 103a is a flat surface. Or, the tilted surface 103a may be a curved surface.

The light distribution control portion 103 is asymmetric with respect to the central axis C of the light guide portion 102. The central axis C is an imaginary axis perpendicular to the bottom surface 102a and passing through the center of the bottom surface 102a of the light guide portion 102. The central axis C of the light guide portion 102 passes through the tilted surface 103a of the light distribution control portion 103; and the upper surface 103b, a vertex, and an edge of the light distribution control portion 103 are not positioned on the central axis C.

Figure 13:
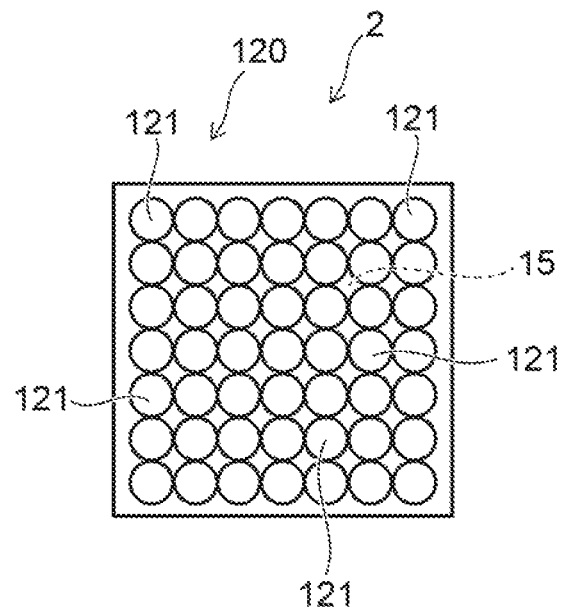
FIG. 13 is a top view of a light-emitting device of a second embodiment of the disclosure.

FIG. 13 is a top view of a light-emitting device 2 of a second embodiment of the disclosure.

The light-emitting device 2 includes the substrate 11, the light-emitting element 10, and a light distribution control member 120. The components other than the light distribution control member 120 are the same configurations as those of the light-emitting device 1 of the first embodiment shown in FIG. 2.

The light distribution control member 120 is disposed on the light-emitting surface 15 of the light-emitting element 10 (the upper surface of the fluorescent layer 14). The light distribution control member 120 is disposed in a region within the surface of the light-emitting surface 15.

Figure 14:
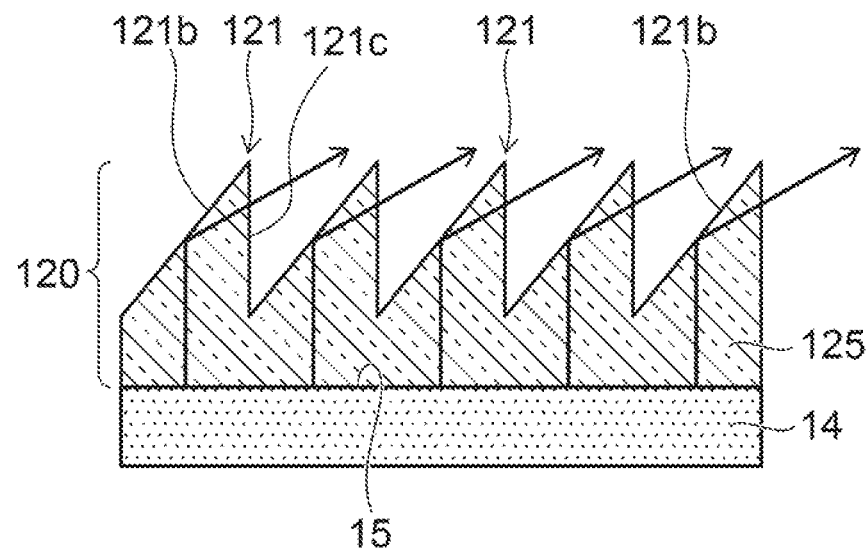
FIG. 14 is a schematic cross-sectional view of a light distribution control member of the light-emitting device of the second embodiment of the disclosure.

FIG. 14 is a schematic cross-sectional view of the light distribution control member 120.

The light distribution control member 120 is transparent to the light emitted by the light-emitting element 10 (the light emitted by the chip 13 and the light emitted by the fluorescent). The light distribution control member 120 may include, for example, a glass material. Or, the light distribution control member 120 may be formed from a resin material.

The light distribution control member 120 includes a base portion 125, and multiple protruding portions 121 provided on the base portion 125. The base portion 125 and the multiple protruding portions 121 are provided as one body of the same material.

The base portion 125 is disposed between the light-emitting surface 15 and the protruding portions 121 and spreads continuously along the surface of the light-emitting surface 15. The base portion 125 supports the multiple protruding portions 121 as one body. The base portion 125 contacts the light-emitting surface 15 (the upper surface of the fluorescent layer 14). Or, the base portion 125 is disposed on the light-emitting surface 15 by interposing a film or the like that is transparent to the light emitted by the light-emitting element 10.

The multiple protruding portions 121 are separated from each other; and air is interposed between the mutually-adjacent protruding portions 121. As shown in FIG. 13, the multiple protruding portions 121 have a uniform arrangement over the entire region of the light-emitting surface 15.

For example, the protruding portion 121 may have a triangular cross section when viewed in the cross-section shown in FIG. 14. In other words, the protruding portion 121 may have a configuration having a tilted surface 121b tilted with respect to the light-emitting surface 15.

Figure 15:
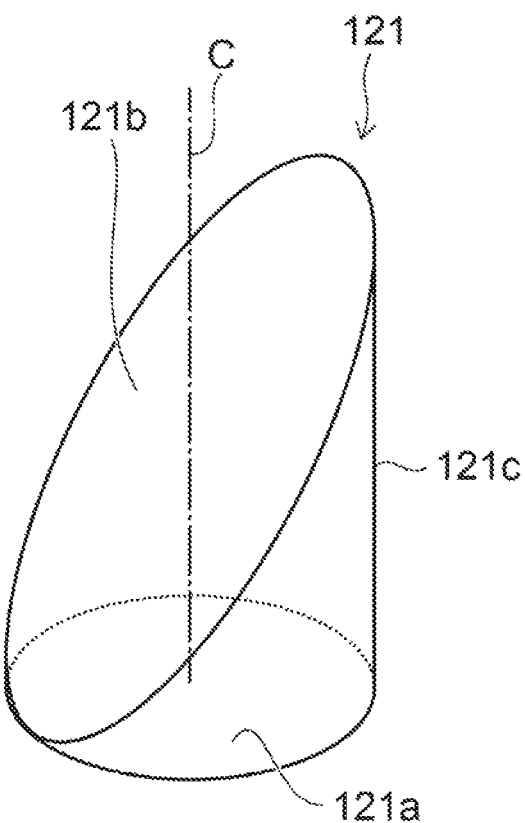
FIG. 15 to FIG. 21 are perspective views of a protruding portion of the light-emitting device of the second embodiment of the disclosure.

FIG. 15 is a perspective view of the protruding portion 121.

The protruding portion 121 may have a configuration in which a portion of a circular column is cut obliquely. The protruding portion 121 has a bottom surface 121a parallel to the light-emitting surface 15, the tilted surface 121b tilted with respect to the bottom surface 121a, and a side surface 121c perpendicular to the bottom surface 121a. The protruding portion 121 is asymmetric with respect to the axis (the imaginary axis) C perpendicular to the bottom surface 121a and passing through the center of the bottom surface 121a. The axis C passes through the tilted surface 121b; and no vertex or edge of the protruding portion 121 is positioned on the axis C.

The tilted surface 121b is a flat surface. Or, the tilted surface 121b may be a curved surface. It is easier to form the protruding portion 121 to have the tilted surface 121b that is the flat surface than to have the tilted surface 121b that is the curved surface.

As shown in FIG. 14, the tilted surface 121b and the side surface 121c of the protruding portion 121 contact air.

The light that is emitted from the light-emitting surface 15 of the light-emitting element 10 enters the light distribution control member 120. The light that enters the light distribution control member 120 travels through the base portion 125 and is reflected at the interface between the air and the tilted surface 121b of the protruding portion 121. The protruding portion 121 can include a material, e.g., glass, having a larger refractive index than air and can cause total internal reflection of the light that is incident on the tilted surface 121b at not less than a constant incident angle (critical angle).

The light that is emitted upward from the light-emitting surface 15 is refracted in a designated direction (a direction tilted with respect to the light-emitting surface 15 or a direction parallel to the light-emitting surface 15) by being reflected by the tilted surface 121b. The light that is reflected by the tilted surface 121b is emitted outside the light-emitting device 2 from the side surface 121c of the protruding portion 121. Thereby, the light that is emitted from the light-emitting device 2 can be controlled to have a light distribution in which the intensity of the light is relatively high in the designated direction and relatively low in directions other than the designated direction.

According to the second embodiment, the light distribution control is performed by the light-emitting device 2 itself. Therefore, it is possible to downsize and reduce the number of components of the secondary lens, the reflector, the prism, etc., included separately from the light-emitting device 2. According to the application, a secondary lens, a reflector, or a prism may be unnecessary. Accordingly, it is possible to downsize, simplify the configuration, and reduce the number of components of the lighting device in which such a light-emitting device 2 is mounted.

It is favorable for the material of the protruding portion 121 to be a glass material having a high refractive index to easily cause total internal reflection at the interface between the tilted surface 121b and the air.

As shown in FIG. 14, the tilt angles with respect to the light-emitting surface 15 of the multiple tilted surfaces 121b of the multiple protruding portions 121 are aligned at the same angle; and the normals of the multiple tilted surfaces 121b are parallel to each other. The fluctuation of the light distribution of the light emitted from the light-emitting device 2 is reduced thereby.

Or, a configuration may be used in which the multiple tilted surfaces 121b disposed in the first region on the light-emitting surface 15 are tilted at the first angle with respect to the light-emitting surface 15; and the multiple tilted surfaces 121b disposed in the second region on the light-emitting surface 15 are tilted at the second angle with respect to the light-emitting surface 15 that is different from the first angle.

FIG. 16 to FIG. 21 are perspective views showing other examples of the protruding portion. The protruding portions shown in FIG. 16 to FIG. 21 are applicable to the light-emitting device 2 of the second embodiment to replace the protruding portion 121 described above.

Figure 16:
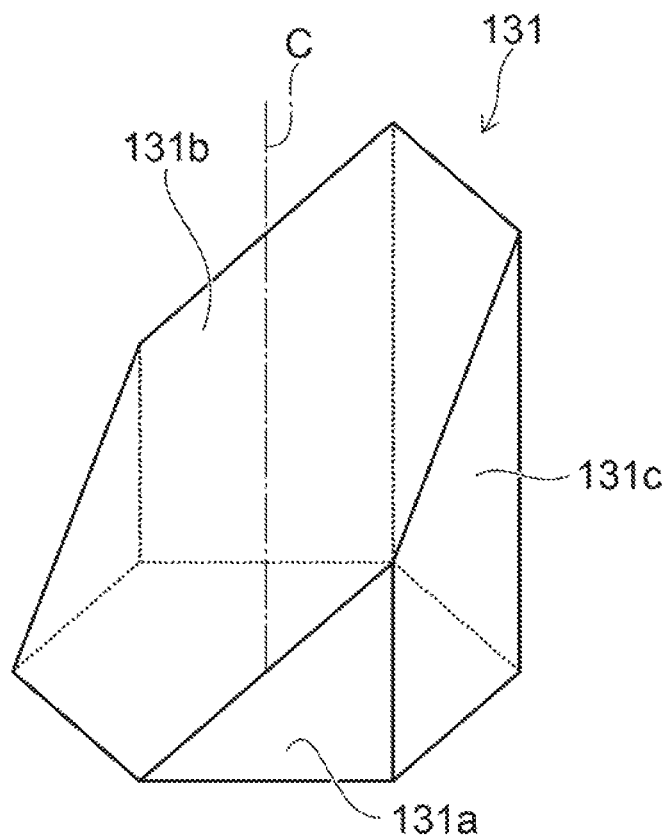

A protruding portion 131 shown in FIG. 16 may have a configuration in which a portion of a hexagonal prism having a hexagonal bottom surface 131a is cut obliquely. The protruding portion 131 has the bottom surface 131a parallel to the light-emitting surface 15, a tilted surface 131b tilted with respect to the bottom surface 131a, and a side surface 131c perpendicular to the bottom surface 131a. The tilted surface 131b is a flat surface. Or, the tilted surface 131b may be a curved surface.

The protruding portion 131 is asymmetric with respect to the axis (the imaginary axis) C perpendicular to the bottom surface 131a and passing through the center of the bottom surface 131a. The axis C passes through the tilted surface 131b; and no vertex or edge of the protruding portion 131 is positioned on the axis C.

Figure 17:
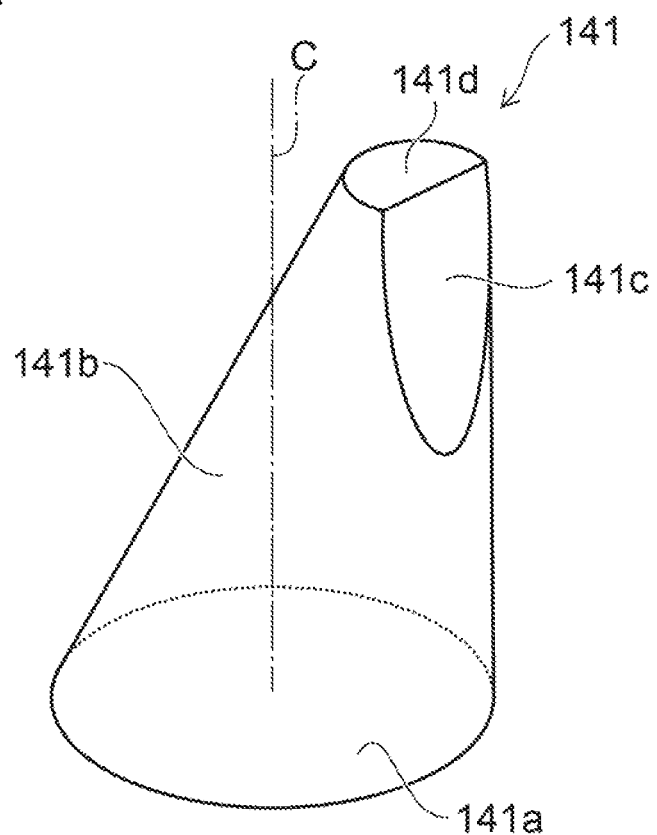

A protruding portion 141 shown in FIG. 17 may have a configuration in which a portion of a side surface of a truncated circular cone having a circular bottom surface 141a is cut. The protruding portion 141 has the bottom surface 141a, an upper surface 141d, a tilted surface 141b, and a side surface 141c.

The bottom surface 141a and the upper surface 141d are parallel to the light-emitting surface 15. The tilted surface 141b is tilted with respect to the bottom surface 141a. The tilted surface 141b is a curved surface. The side surface 141c is perpendicular to the bottom surface 141a. The center of the upper surface 141d is shifted with respect to the center of the bottom surface 141a.

The protruding portion 141 is asymmetric with respect to the axis (the imaginary axis) C perpendicular to the bottom surface 141a and passing through the center of the bottom surface 141a. The axis C passes through the tilted surface 141b; and the upper surface 141d is not positioned on the axis C.

Figure 18:
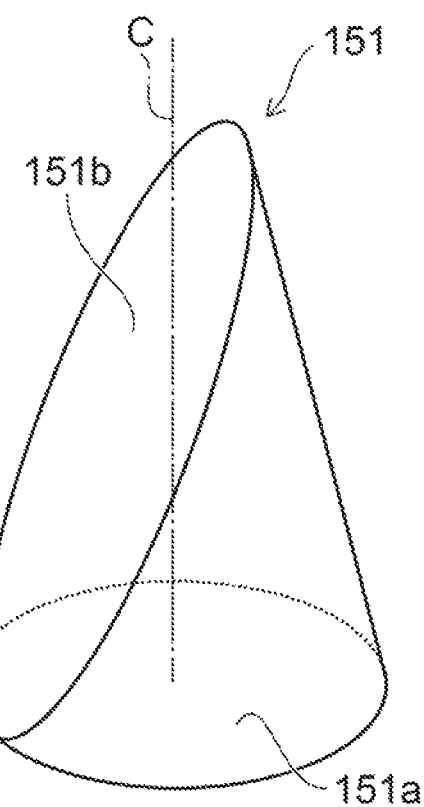

A protruding portion 151 shown in FIG. 18 may have a configuration in which a portion of a circular cone having a circular bottom surface 151a is cut obliquely. The protruding portion 151 has the bottom surface 151a parallel to the light-emitting surface 15, and a tilted surface 151b tilted with respect to the bottom surface 151a. The tilted surface 151b is a flat surface. Or, the tilted surface 151b may be a curved surface.

The protruding portion 151 is asymmetric with respect to the axis (the imaginary axis) C perpendicular to the bottom surface 151a and passing through the center of the bottom surface 151a. The axis C passes through the tilted surface 151b; and no vertex or edge of the protruding portion 151 is positioned on the axis C.

Figure 19:
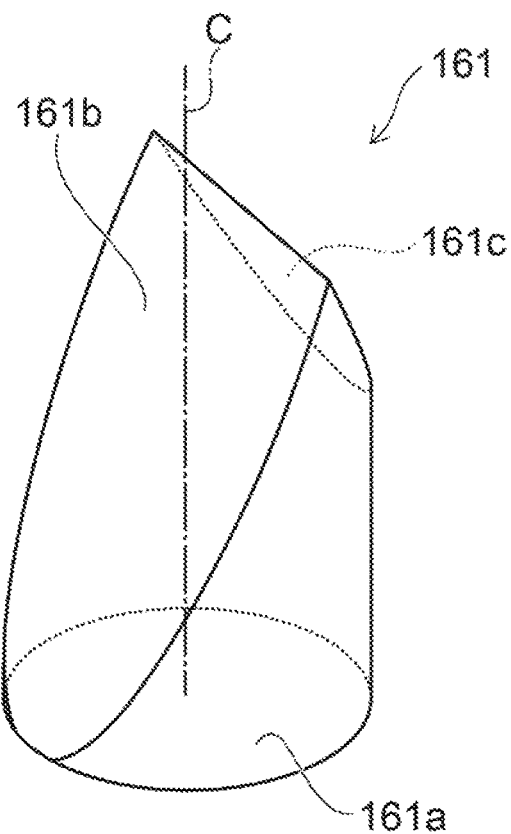

A protruding portion 161 shown in FIG. 19 may have a configuration in which a circular column having a circular bottom surface 161a is cut obliquely at multiple locations (e.g., two locations). The protruding portion 161 has the bottom surface 161a parallel to the light-emitting surface 15, and two tilted surfaces 161b and 161c tilted with respect to the bottom surface 161a. The tilted surfaces 161b and 161c are flat surfaces. Or, the tilted surfaces 161b and 161c may be curved surfaces.

The protruding portion 161 is asymmetric with respect to the axis (the imaginary axis) C perpendicular to the bottom surface 161a and passing through the center of the bottom surface 161a. The axis C passes through the tilted surface 161b; and no vertex or edge of the protruding portion 161 is positioned on the axis C.

Figure 20:
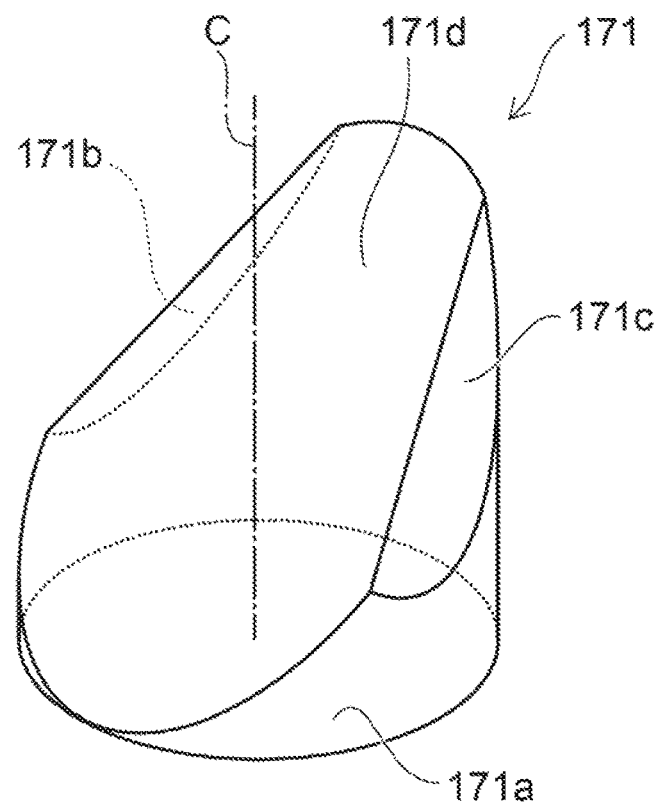

A protruding portion 171 shown in FIG. 20 may have a configuration in which a circular column having a circular bottom surface 171a is cut obliquely at multiple locations (e.g., three locations). The protruding portion 171 has the bottom surface 171a parallel to the light-emitting surface 15, and three tilted surfaces 171b, 171c, and 171d tilted with respect to the bottom surface 171a. The tilted surfaces 171b, 171c, and 171d are flat surfaces. Or, the tilted surfaces 171b, 171c, and 171d may be curved surfaces.

The protruding portion 171 is asymmetric with respect to the axis (the imaginary axis) C perpendicular to the bottom surface 171a and passing through the center of the bottom surface 171a. The axis C passes through the tilted surface 171d; and no vertex or edge of the protruding portion 171 is positioned on the axis C.

Figure 21:
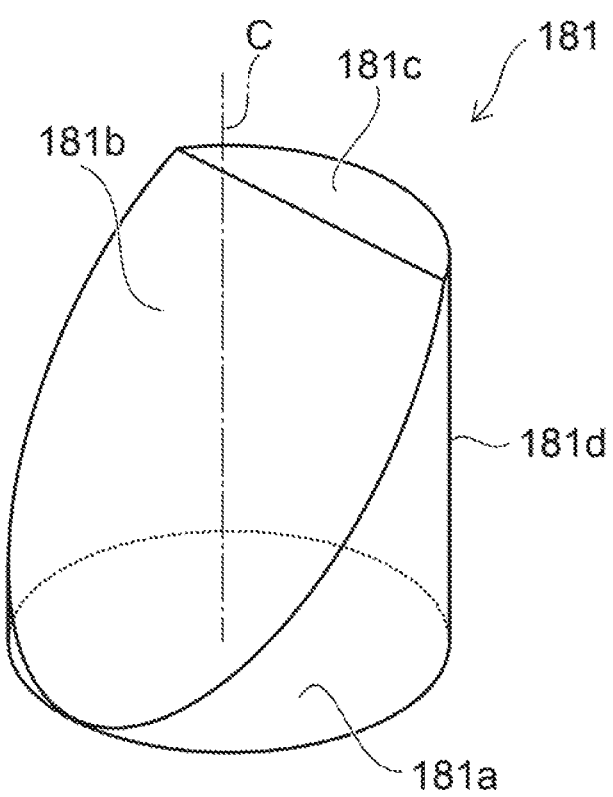

A protruding portion 181 shown in FIG. 21 may have a configuration in which a portion of a circular column having a circular bottom surface 181a is cut obliquely. The protruding portion 181 has the bottom surface 181a parallel to the light-emitting surface 15, an upper surface 181c parallel to the light-emitting surface 15, a tilted surface 181b tilted with respect to the bottom surface 181a, and a side surface 181d perpendicular to the light-emitting surface 15. The tilted surface 181b is a flat surface. Or, the tilted surface 181b may be a curved surface.

The protruding portion 181 is asymmetric with respect to the axis (the imaginary axis) C perpendicular to the bottom surface 181a and passing through the center of the bottom surface 181a. The axis C passes through the tilted surface 181b; and the upper surface 181c, a vertex, and an edge of the protruding portion 181 are not positioned on the axis C.

Certain examples of the present invention have been described above. However, the present invention is not limited to these examples. Based on the above-described embodiments, all embodiments of the present invention within the spirit of the present invention that may be implemented by one skilled in the art are also within the scope of the present invention. Additionally, one skilled in the art may conceive of various modifications that also fall within the scope of the present invention.

What is claimed is:

1. A light-emitting device, comprising:
   a light-emitting source element having a light-emitting surface; and
   a plurality of protruding portions being separated from each other and disposed on the light-emitting surface of the light-emitting source element, the protruding portions being transparent,
   each of the protruding portions including a light guide portion and a light distribution control portion, the light guide portion having a columnar configuration and being provided at a light-emitting surface side of the protruding portion, the light distribution control portion being provided on the light guide portion,
   the light distribution control portion being asymmetric with respect to a central axis of the light guide portion and having a tilted surface that is tilted with respect to the central axis.

2. The device according to claim 1, wherein an angle of a side surface of the light guide portion with respect to a bottom surface of the light guide portion is 90° or less.

3. The device according to claim 1, wherein the tilted surface is a flat surface.

4. The device according to claim 3, wherein normals of the tilted surfaces of the plurality of protruding portions are parallel to each other.

5. The device according to claim 1, wherein the tilted surface contacts air.

6. The device according to claim 1, wherein a side surface of the light guide portion contacts air.

7. The device according to claim 1, wherein the protruding portions are made of a glass material.

8. The device according to claim 1, wherein
   the light-emitting element includes a fluorescent layer, and
   the light-emitting surface is an upper surface of the fluorescent layer.

9. A light-emitting device, comprising:
a light-emitting source element having a light-emitting surface; and
a plurality of protruding portions being separated from each other and disposed on the light-emitting surface of the light-emitting source element, the protruding portions being transparent,
each of the protruding portions having a bottom surface and a tilted surface, the bottom surface being a circle or an n-gon (n being an integer of 5 or more), the tilted surface being tilted with respect to the bottom surface,
each of the protruding portions being asymmetric with respect to an axis perpendicular to the bottom surface, the axis passing through a center of the bottom surface.

10. The device according to claim 9, wherein the tilted surface is a flat surface.

11. The device according to claim 10, wherein normals of the tilted surfaces of the plurality of protruding portions are parallel to each other.

12. The device according to claim 9, wherein the tilted surface contacts air.

13. The device according to claim 9, wherein the protruding portions are made of a glass material.

14. The device according to claim 9, wherein
the light-emitting element includes a fluorescent layer, and
the light-emitting surface is an upper surface of the fluorescent layer.

15. The device according to claim 1, wherein the light-emitting element includes a semiconductor stacked portion.

16. The device according to claim 9, wherein the light-emitting element includes a semiconductor stacked portion.

\* \* \* \* \*